(12) United States Patent
Kim et al.

(10) Patent No.: US 9,847,106 B1
(45) Date of Patent: Dec. 19, 2017

(54) WIDE RANGE ESD PROTECTION WITH FAST POR TRANSIENT TIME

(71) Applicant: Seagate Technology LLC, Cupertino, CA (US)

(72) Inventors: Byung Wook Kim, Gyeonggi-do (KR); Sang Gwon Hwang, Songpa-gu (KR); Chea Jung Lim, Kyunggi-do (KR); In Su Lee, Gyeonggi-do (KR)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/251,621

(22) Filed: Aug. 30, 2016

(51) Int. Cl.
| | |
|---|---|
| *G11C 5/14* | (2006.01) |
| *H01L 27/02* | (2006.01) |
| *H03K 17/22* | (2006.01) |
| *G11C 7/20* | (2006.01) |
| *H02H 9/04* | (2006.01) |
| *H03K 17/14* | (2006.01) |
| *G07C 9/00* | (2006.01) |

(52) U.S. Cl.
CPC .............. *G11C 5/14* (2013.01); *G11C 7/20* (2013.01); *H01L 27/0288* (2013.01); *H02H 9/046* (2013.01); *H03K 17/223* (2013.01); *G07C 9/00182* (2013.01); *H01L 27/0259* (2013.01); *H03K 17/145* (2013.01)

(58) Field of Classification Search
CPC . G11C 5/14; G11C 7/20; H02H 9/046; H03K 17/223; H03K 17/145; H01L 27/0288; H01L 27/0259; G07C 9/00182
See application file for complete search history.

(56) References Cited

U.S. PATENT DOCUMENTS

| | | | | |
|---|---|---|---|---|
| 5,742,902 | A | * | 4/1998 | Shore ................. G07C 9/00182 340/12.5 |
| 5,778,238 | A | * | 7/1998 | Hofhine ............... H03K 17/223 327/143 |
| 7,564,279 | B2 | | 7/2009 | Tang et al. |
| 7,777,537 | B2 | | 8/2010 | Demolli et al. |
| 7,881,144 | B1 | | 2/2011 | Maung et al. |
| 8,072,722 | B1 | * | 12/2011 | Hwang .................. H02H 9/046 361/56 |
| 8,508,264 | B1 | | 8/2013 | Wang et al. |

(Continued)

*Primary Examiner* — Harry W Byrne
*Assistant Examiner* — Ajay Ojha
(74) *Attorney, Agent, or Firm* — Westman, Champlin & Koehler, P.A.

(57) ABSTRACT

A POR circuit includes a voltage divider coupleable between a supply voltage and a POR trace, including a first element coupled between the supply voltage and a node, and a second element coupled between the node and the POR trace. A switch is drain to source coupled between the POR trace and a reference voltage. A first decoupling capacitor is coupled between the POR trace and the reference voltage. A second decoupling capacitor is coupled between the node and the reference voltage. ESD protection for an integrated circuit includes charging a node of a voltage divider coupled between a supply voltage and a POR trace to a predetermined percentage of the supply voltage, decoupling high frequency noise with a first decoupling capacitor between the POR trace and a reference voltage, and decoupling low frequency noise with a second decoupling capacitor between the node and the reference voltage.

19 Claims, 9 Drawing Sheets

(56) References Cited

U.S. PATENT DOCUMENTS

| | | |
|---|---|---|
| 8,736,319 B2 | 5/2014 | Newman et al. |
| 8,963,590 B2 | 2/2015 | Guimont et al. |
| 9,270,265 B2 | 2/2016 | Nakamoto et al. |
| 2004/0041601 A1* | 3/2004 | Payne ............... H03K 17/145 327/143 |
| 2005/0289262 A1* | 12/2005 | Sutardja ............. G06F 3/0613 710/74 |
| 2006/0163660 A1* | 7/2006 | Jin ................... H01L 27/0259 257/361 |
| 2011/0317319 A1* | 12/2011 | Wu .................... H02H 9/046 361/56 |

\* cited by examiner

WIDE RANGE ESD PROTECTION WITH FAST POR TRANSIENT TIME

BACKGROUND

Data storage/memory devices are one of many components of modern computers. Examples of data storage devices include hard disk drives (HDDs), which are electromechanical devices containing spinning discs and movable read/write heads, solid state drives (SSDs) with no moving parts, and hybrid drives, which combine features of HDDs and SSDs in one unit. Data storage/memory devices are also present in many additional devices, such as table computers, smart phones, and the like.

Data storage/memory devices may be subject to a wide variety of electrostatic discharge (ESD) events. Such ESD events can be particularly problematic to power status monitoring circuits and functions, which rely on stable power in order to properly operate. When stable power is not present, power on reset (POR) circuits prevents starting operation of the device prior to the provision of stable power. When power becomes unstable, POR circuits force stopping operation of the device. Accordingly, protection from ESD events is typically provided on such devices, as well as on other integrated circuits such as those that include POR circuitry.

SUMMARY

The present disclosure relates to ESD protection in POR circuits.

In one embodiment, a power on reset circuit includes a pullup device having a voltage divider with a first end coupleable to a supply voltage, a second end, and a pair of passive electronic components such as resistors. A first of the pair of elements is coupled between the first end and a node between the pair of elements, and a second of the pair of elements is coupled between the node and the second end. A switch is drain to source coupled between the second end and a reference voltage. A first decoupling capacitor is coupled between the second end and the reference voltage, and a second decoupling capacitor is coupled between the node and the reference voltage.

In one method embodiment, a method of electrostatic discharge protection for an integrated circuit includes charging a node of a voltage divider coupled between a supply voltage and a power on reset trace to a predetermined percentage of the supply voltage. High frequency noise is decoupled with a first decoupling capacitor between the power on reset trace and a reference voltage. Low frequency noise is decoupled with a second decoupling capacitor between the node and the reference voltage.

This summary is not intended to describe each disclosed embodiment or every implementation of the wide range ESD protected fast POR transient time circuit. Many other novel advantages, features, and relationships will become apparent as this description proceeds. The figures and the description that follow more particularly exemplify illustrative embodiments.

DETAILED DESCRIPTION OF ILLUSTRATIVE EMBODIMENTS

Embodiments described below relate to POR circuits with ESD protection and fast transient rise time.

Figure 1:
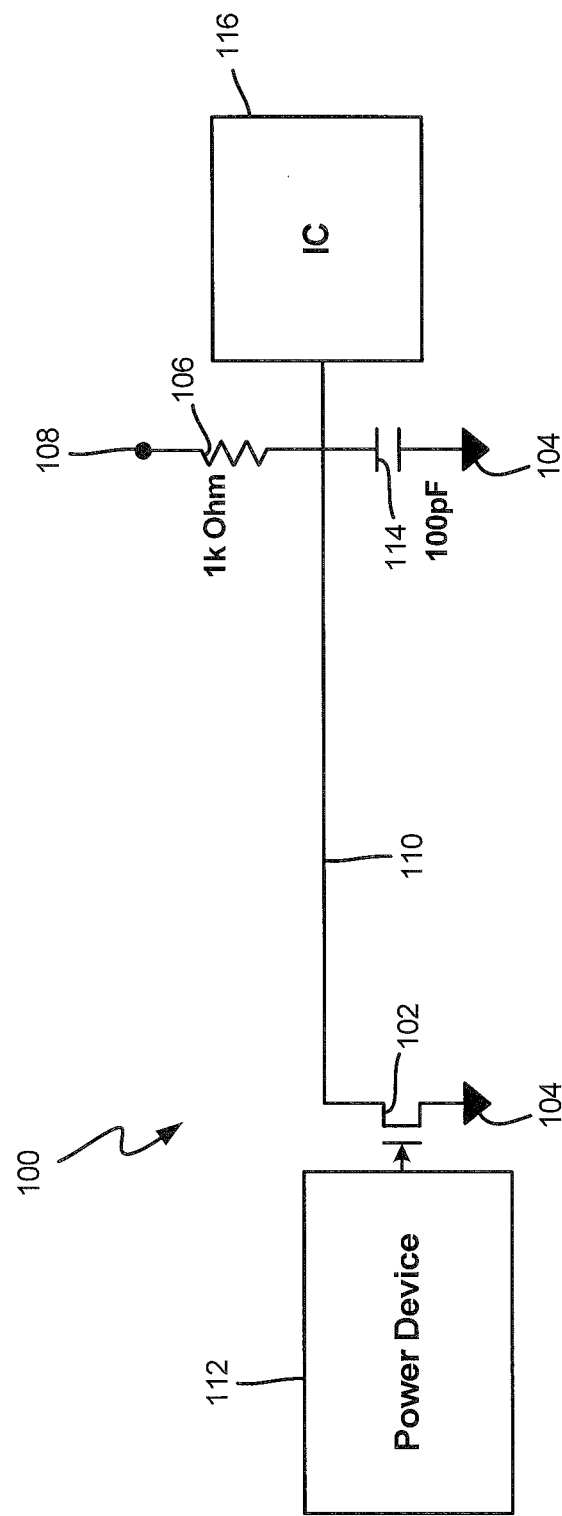
FIG. 1 is a diagram of a first POR circuit.

FIG. 1 is a first power on reset circuit. Circuit 100 includes an open drain type switch 102 to ground 104, a pull up resistor 106 to a supply voltage 108, and a decoupling capacitor 114 coupled between the POR trace 110 and ground 104. The POR trace 110 is also coupled to integrated circuit 116 receiving power from the power device 112. The POR trace 110 stays coupled to ground 104 when power from device 112 is not stable, by holding the switch 102 on to short the POR trace 110 to ground 104. POR is coupled to the supply voltage 108 through pullup resistor 106 after stable power is available, by switching the switch 102 off. During a transient time between the low to high POR signal change, the POR signal rise time is proportional to the pull up resistor 106 value times the decoupling capacitor 114 value. If the decoupling capacitor 114 capacitance value is large, the POR rise time is slow, and may be not suitable for the proper operation of attached integrated circuits IC.

Figure 2:
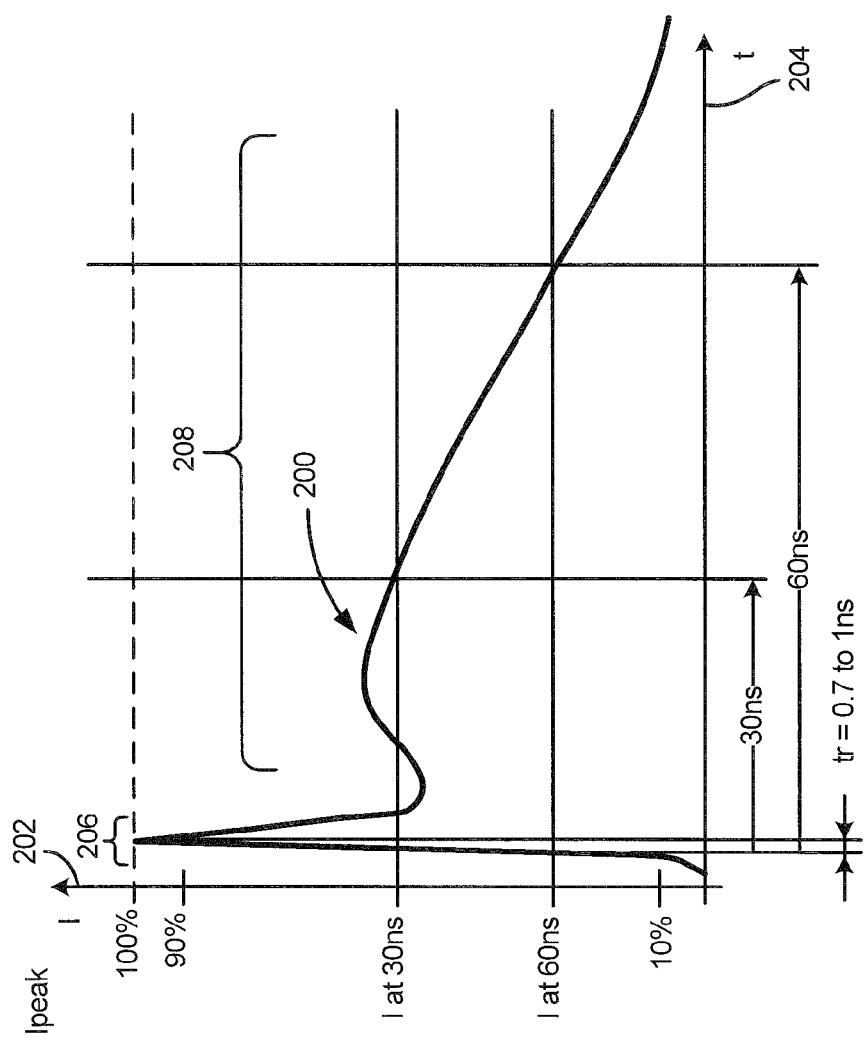
FIG. 2 is a graph of a typical ESD event.

FIG. 2 is a graph showing a typical ESD event pulse waveform of current 202 versus time 204. An ESD event such as ESD event 200 is typically a ground voltage fluctuation with fast rising time and slow decay time. These times are equivalent to high and low frequency noise. In a circuit with no decoupling capacitors, such as circuit 100 of FIG. 1 without decoupling capacitor 114, the POR trace 110 voltage remains constant with no noise (for example, 1.8V, no noise), while the ground voltage level fluctuates. In this instance, if the integrated circuit determines a POR change using a voltage difference between the POR trace 110 to ground 104, the voltage difference does not remain constant during an ESD event. When the observed voltage difference becomes too small, the integrated circuit 116 may incorrectly detect a POR change due to the ESD event. A decoupling capacitor such as capacitor 114 could prevent this since the ground voltage fluctuation is coupled to the POR trace 110 by the decoupling capacitor 114. Therefore, the POR voltage level is not constant, but fluctuates from the ground voltage (for example, 1.8V+AC noise). In this instance, the POR trace 110 and ground 104 have the same AC components, preventing incorrect IC POR detection during an ESD event.

Using a single decoupling capacitor such as capacitor 114 introduces frequency limited characteristics of operation of the circuit. A small capacitance value decoupling capacitor effectively couples a fast changing ground voltage fluctuation (introduced by the initial rise of the ESD event of FIG. 2 in the region 206. A large value decoupling capacitor effectively couples a slow changing ground voltage fluctuation (introduced by the decay of the ESD event of FIG. 2 in the region 208). As presented in the graph of FIG. 2, an ESD event can cause both fast (region 206) and slow (region 208) ground voltage fluctuation.

Figure 3:
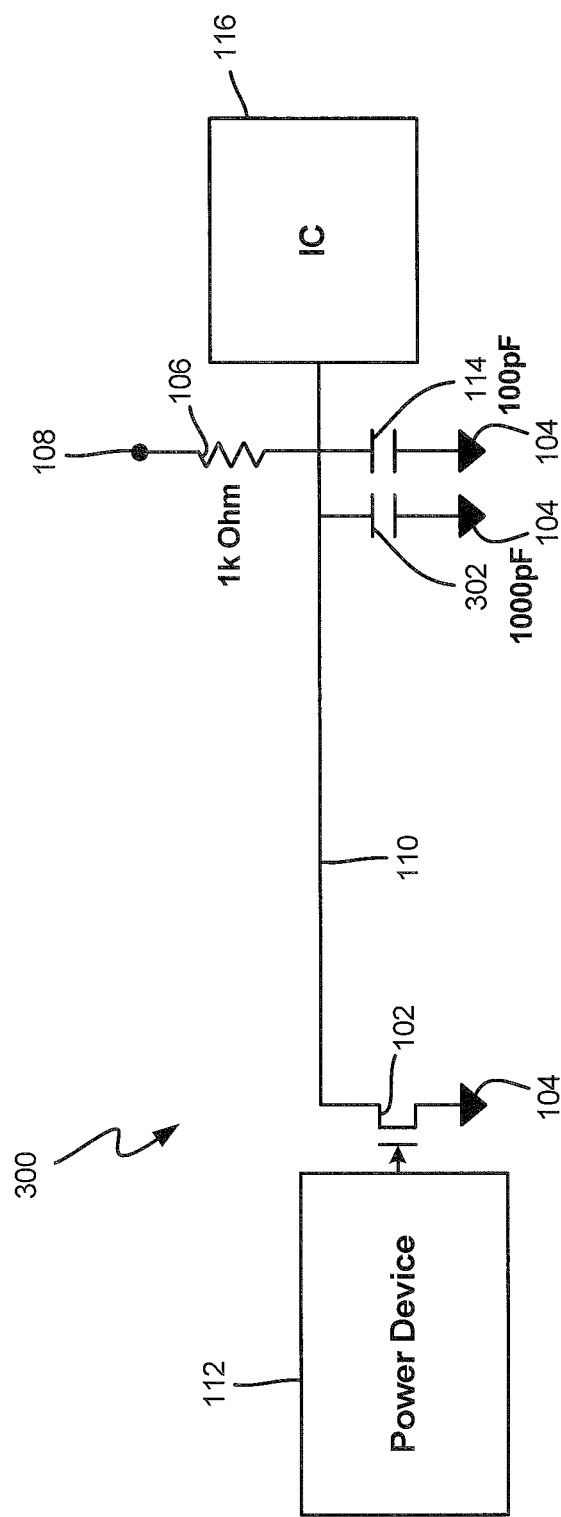
FIG. 3 is a diagram of a second POR circuit.

In a second circuit 300, shown in circuit diagram form in FIG. 3, the circuit 100 is provided with a second decoupling capacitor 302 coupled between the POR trace 110 and ground 104, in parallel with the decoupling capacitor 114. In circuit 300, decoupling capacitor 302 is a high value decoupling capacitor, and decoupling capacitor 114 is a low value decoupling capacitor.

With the circuit 300 of FIG. 3, during a transient time between POR low voltage and POR high voltage, the changing rate (e.g., rise time) is proportional to the product of the value of resistor 106 (e.g., 1 kOhm) and the decoupling capacitor values (e.g., 1000 pF and 100 pF). A higher resistance and/or higher capacitance values will result in a longer transient time. For example, if capacitor 302 with a value of 1000 pF is added to the exiting capacitor with a value of 100 pF to protect a slow changing ESD noise, the result is a POR rise time that is 11 times longer than the rise time with only the low value capacitor 114. Since many integrated circuits utilize fast POR transient times (for example, less than 0.992 microseconds), the addition of the high decoupling capacitor 302 can result in longer POR low to high transient time than is allowed by the integrated circuit, therefore leading to failure to be ready for power on.

Figure 4:
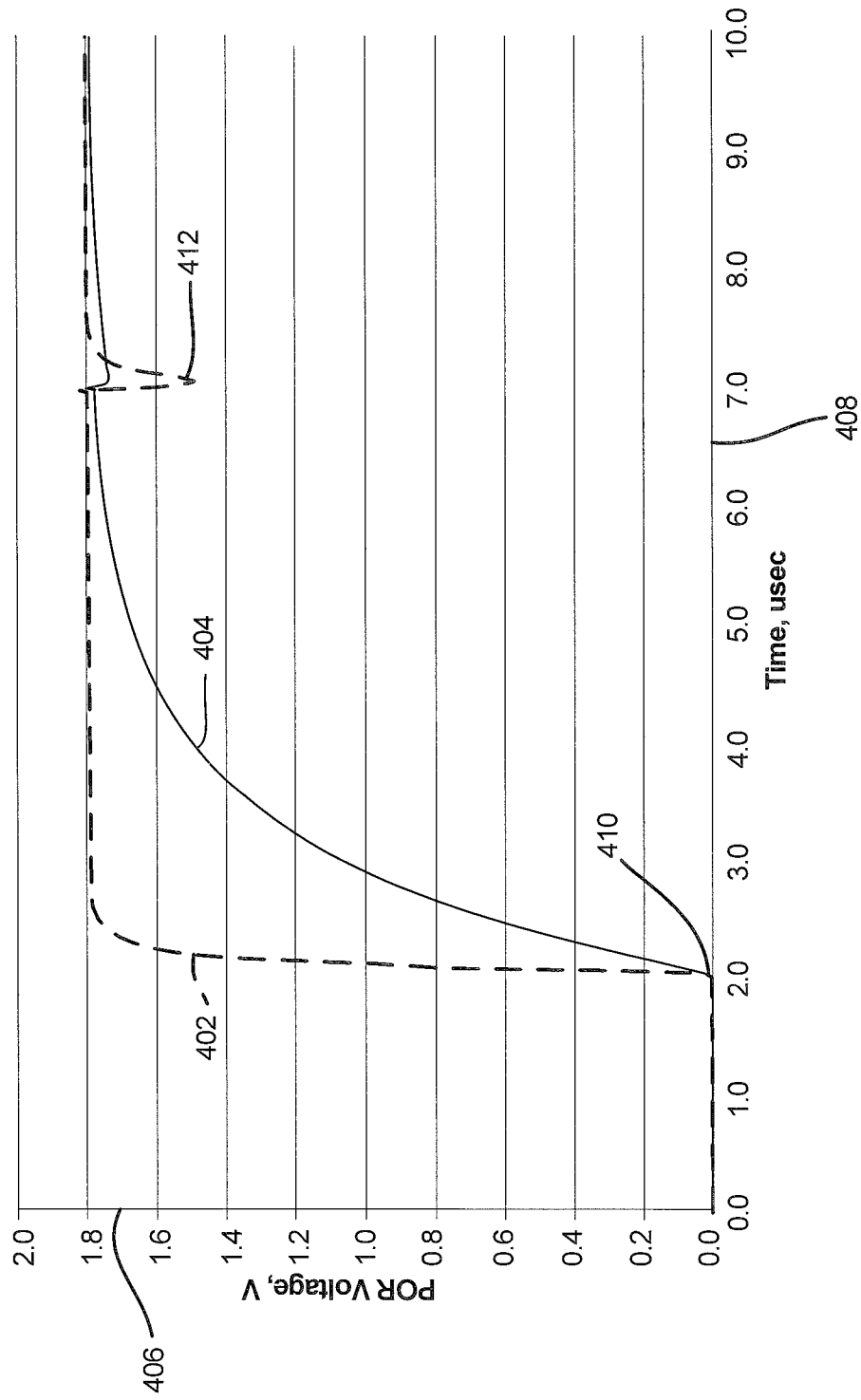
FIG. 4 is a graph of POR voltage versus time for the circuits of FIGS. 1 and 3.

FIG. 4 is a graph showing POR voltage (vertical axis 406) versus time (horizontal axis 408) for the circuits 100 and 300 of FIGS. 1 and 3. Line 402 represents circuit 100, and line 404 represents circuit 300. POR begins its transition 410 from low to high at t=2.0 μsec, and an ESD event 412 is introduced at 7.0 μsec. As can be seen, a single capacitor circuit (100) has a fast rise time, but poor ESD protection. A double capacitor circuit (300) has better ESD protection, but a much slower rise time. As described herein, each circuit, 100 and 300, has potential drawbacks.

Figure 5:
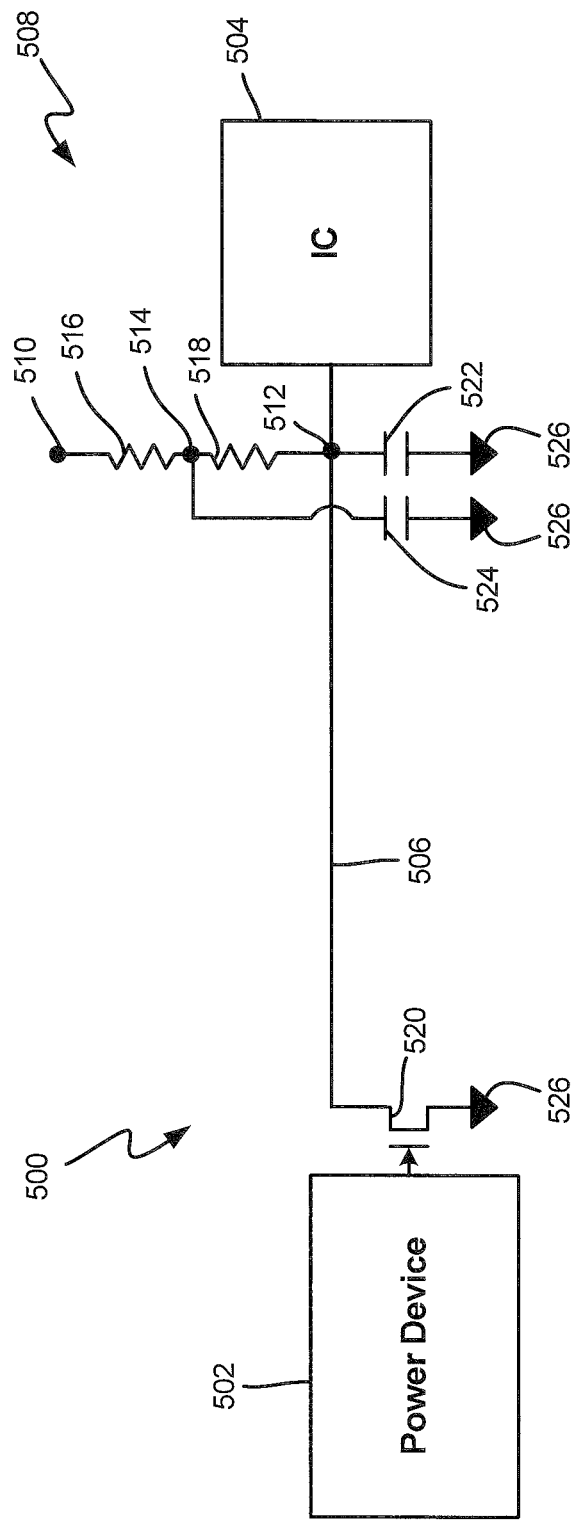
FIG. 5 is a diagram of a POR circuit according to an embodiment of the present disclosure.

A power on reset circuit 500 according to one embodiment of the present disclosure is shown in circuit diagram form in FIG. 5. Power on reset circuit 500 provides a wide range of electrostatic discharge (ESD) protection for an integrated circuit 504 which receives power from a power device 502. A power on reset signal is generated by the power device 502. Power device monitors a status of power and provides an indication of that status to other devices, such as integrated circuit 504, which rely on stable and sufficient power for proper operation. Power device 502 is coupled to a POR trace 506 through an open drain connected switch 520. Switch 520 is coupled between POR trace 506 and a reference voltage 526 (e.g., a ground voltage). When power is not stable, switch 520 is on, and POR trace 506 is coupled directly to the reference voltage 526. When power is stable, switch 520 is off and POR trace 506 is charged according to the values of components of voltage divider 508 and first (522) and second (524) decoupling capacitors. POR trace 506 is coupled to integrated circuit 504.

Voltage divider 508 comprises two resistors 516 and 518, with first resistor 516 coupled between supply voltage 510 (in one embodiment approximately 1.8 Volts) and center node 514, and second resistor 518 coupled between center node 514 and POR trace 506. In one embodiment, the first resistor 516 and the second resistor 518 have resistances chosen to charge node 514 to approximately 90% of supply voltage 510 when POR is low. One choice for resistances for 516 and 518 is, respectively, 100 Ohms (Ω) and 900Ω.

First decoupling capacitor 522 is coupled between POR trace 506 and reference voltage 526, and second decoupling capacitor 524 is coupled between node 514 and reference voltage 526. First decoupling capacitor 522 has a low capacitance value, relative to capacitor 524, chosen to decouple high frequency noise. Second decoupling capacitor 524 has a high capacitance value, relative to capacitor 522, chosen to decouple low frequency noise. In one embodiment, capacitor 522 has a capacitance of 100 picoFarads (pF), and capacitor 524 has a capacitance of 1000 pF.

In operation of a device containing an integrated circuit, an ESD event can introduce a wide frequency range noisy transient into a POR circuit such as circuit 500. If an integrated circuit that is responsive to the POR signal interprets this noisy signal as a true POR signal, then the integrated circuit may perform a power on reset cycle that should not be performed. Such an unintended reset may lead to ESD failure of the device or integrated circuit. To prevent this, the decoupling capacitors 522 and 524 are be used in one embodiment to address high and low frequency noise, respectively, into the POR circuit 500.

Since an ESD event can introduce a wide frequency range noisy signal, decoupling of noise over a wide frequency range is beneficial. Such decoupling of a wide frequency range noise signal uses in one embodiment the low and high value capacitors 522 and 524, respectively. An ESD event typically has a fast initial rise time, followed by a slow decay, as shown in FIG. 2.

A single pullup resistor as used in the first and second circuits is, in the embodiment of FIG. 5, replaced with a voltage divider 508. High value decoupling capacitor 524 is coupled to node 514 between resistors 516 and 518 to protect low frequency noise components from an ESD event. Low value decoupling capacitor 522 is coupled to the POR trace 506 to protect high frequency noise components from an ESD event.

The resistance and capacitance values are chosen in one embodiment to protect against both a fast rise time and a slow decay time. The low value decoupling capacitor 522 couples fast changing ground voltage fluctuation into the POR trace 506 and the high value decoupling capacitor 524 couples slow changing ground voltage fluctuation through resistor 518 into POR trace 506. With this configuration, the circuit 500 provides fast POR low to high transient time since the low value decoupling capacitor 522 dominates the initial approximately 90% of POR low to high transient, and the high value decoupling capacitor 524 dominates the last approximately 10% of POR low to high transient. Therefore, most of the transient time is determined by the low decoupling capacitor 522, which allows for fast transient time.

ESD protection by the POR circuit 500 of FIG. 5 functions as follows. Node 514 of voltage divider 508 coupled between supply voltage 510 and power on reset trace 506 is charged to a predetermined percentage of the supply voltage 510, high frequency noise is decoupled with a first decoupling capacitor 522 between the power on reset trace 506 and a reference voltage 526 (e.g., ground), and low frequency noise is decoupled with a second decoupling capacitor 524 between the node 514 and the reference voltage 526.

Figure 6:
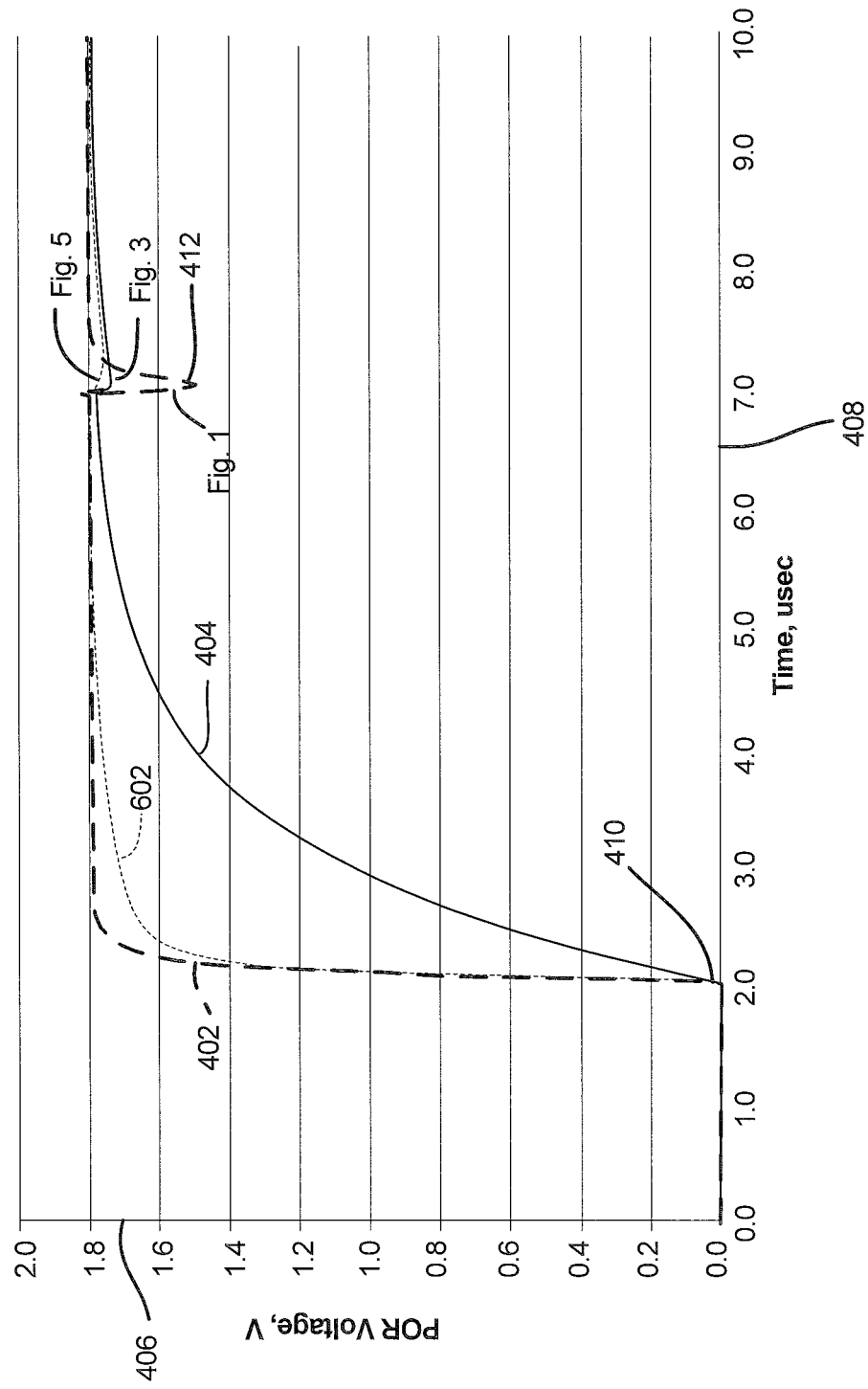
FIG. 6 is a graph of POR voltage versus time for the circuits of FIGS. 1, 3, and 5.

FIG. 6 is a graph showing simulation results of POR voltage versus time for the circuits of FIGS. 1 (circuit 100, line 402), 3 (circuit 300, line 404), and 5 (circuit 500, line 602), where capacitance values of capacitors 114 and 522 are 100 pF, capacitance 302 is 1000 pF, capacitance 524 is 10000 pF, resistance 106 is 1 kΩ, resistance 516 is 100Ω, and resistance 518 is 900Ω. As can be seen, the initial rise time for the circuit 500 for approximately 90% of the transient rise is very similar to that of a single capacitance circuit 100, and faster than the circuit 300. Further, the disturbance to the POR voltage of circuit 500 due to an ESD event is smaller than that of either circuits 100 or 300. The circuit 500 provides high ESD protection with fast transient time.

Figure 7:
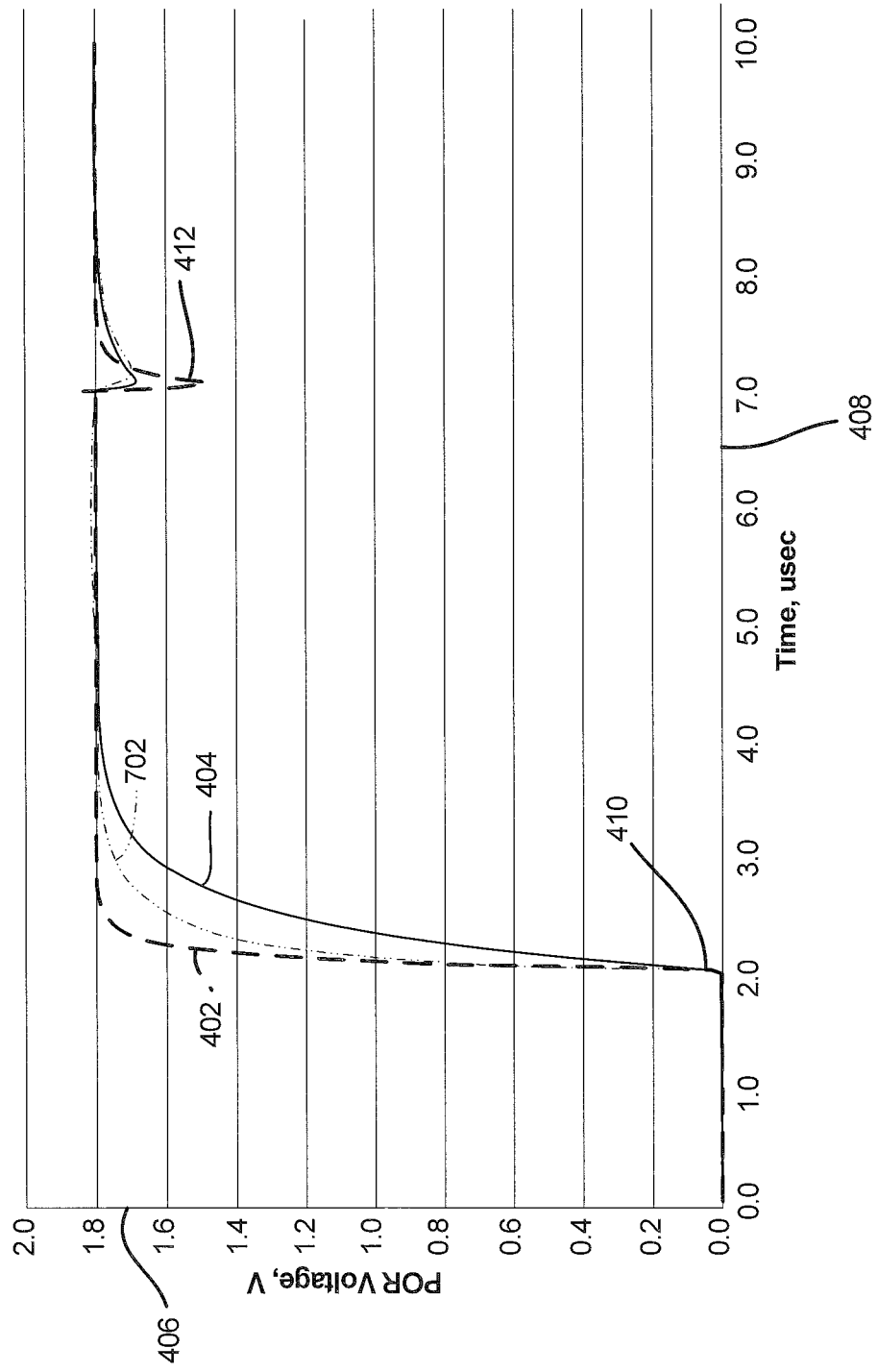
FIGS. 7 and 8 are graphs of POR voltage versus time for FIGS. 1 and 3, and for additional embodiments of the circuit of FIG. 5.

Further choices for the values of capacitances and resistances in the circuit 500 show that even faster rise times and nearly equivalent ESD protection can be obtained. FIG. 7 is a graph showing simulation results of POR voltage versus time for the circuits of FIGS. 1 (circuit 100, line 402), 3 (circuit 300, line 404), and 5 (circuit 500, line 702), where capacitance values of capacitors 114 and 522 are 100 pF, capacitance 302 is 300 pF, capacitance 524 is 1000 pF, resistance 106 is 1 kΩ, resistance 516 is 300Ω, and resistance 518 is 700Ω. As can be seen, the initial rise time for the circuit 500 for approximately 70% of the transient rise is very similar to that of a single capacitance circuit 100, and faster than the circuit 300. Further, the disturbance to the POR voltage of circuit 500 due to an ESD event is smaller than that of circuit 100, and roughly equivalent to that of circuit 300. The circuit 500 provides high ESD protection with fast transient time.

Figure 8:
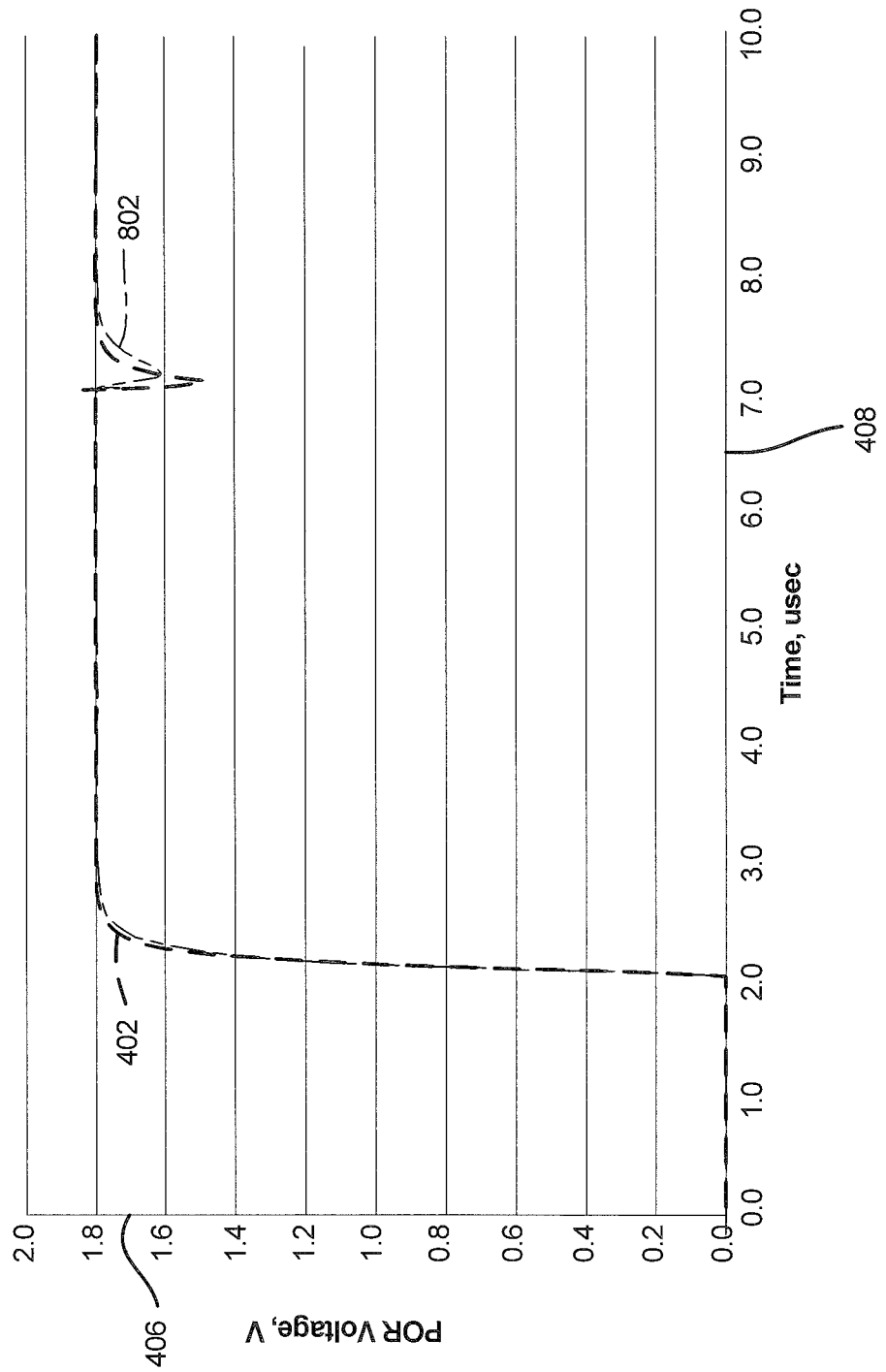

FIG. 8. is a graph showing simulation results of POR voltage versus time for the circuits of FIGS. 1 (circuit 100, line 402) and 5 (circuit 500, line 802), where capacitance values of capacitors 114 and 522 are 100 pF, capacitance 524 is 1000 pF, resistance 106 is 1 kΩ, resistance 516 is 100Ω, and resistance 518 is 900Ω. As can be seen, the initial rise time for the circuit 500 is nearly identical to that of a single capacitance circuit 100. Further, the disturbance to the POR voltage of circuit 500 due to an ESD event is smaller than that of circuit 100. The circuit 500 provides high ESD protection with fast transient time.

By a choice of a combination of resistance values and decoupling capacitor values in circuit 500, a wide range ESD protection with a fast POR transient time is achieved. Choice of the resistance and capacitance values may be made to accommodate specifics of integrated circuits that are coupled to the POR circuit. In this disclosure, equivalent inductances of capacitors are assumed as 100 pF=1 nanoHenry (nH), 300 pF=1.5 nH, 1000 pF=3 nH, and 10000 pF=6 nH in the simulations to represent the limited frequency characteristics of real capacitors.

Table 1 is a summary of measured POR rise time and ESD performance of circuits 100 and 500 with the values presented in FIG. 8, showing measured POR transient time and ESD performance comparison.

TABLE 1

|  | Measured POR rise (10%-90%) | ESD pass level Positive ESD event | ESD pass level Negative ESD event |
| --- | --- | --- | --- |
| Circuit 100 | 0.4 μsec | 4 kV | −6 kV |
| Circuit 500 | 0.4 μsec | 10 kV | −8 kV |

Figure 9:
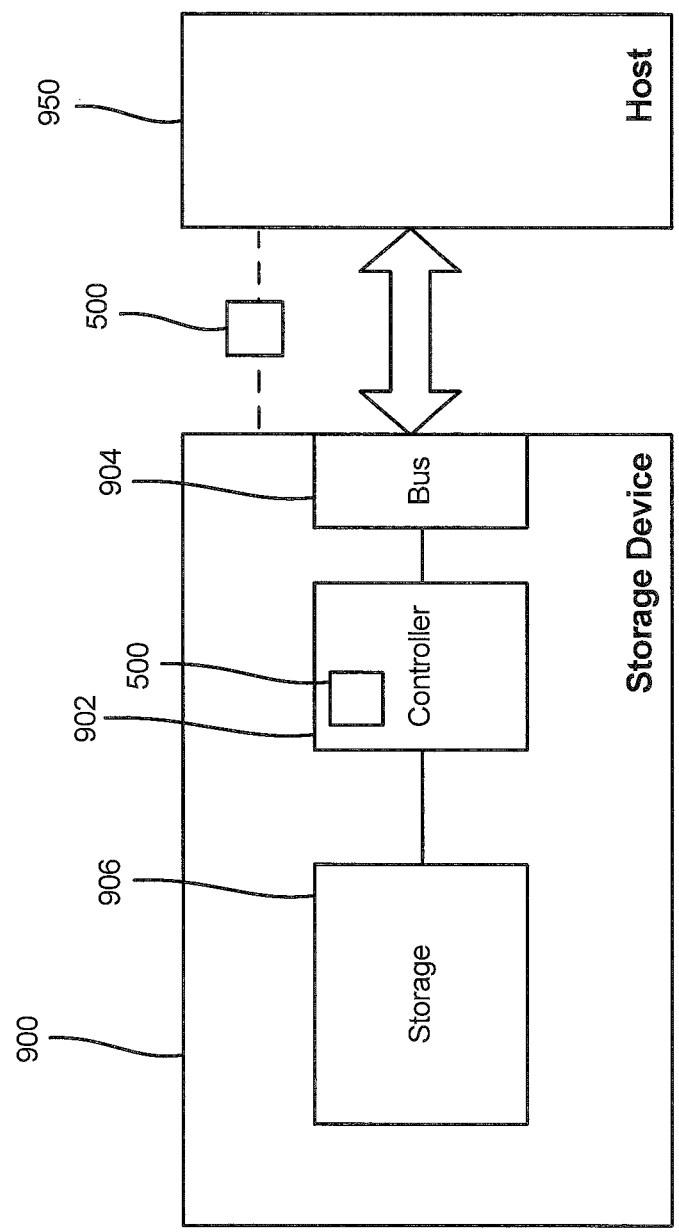
FIG. 9 is a block diagram of a data storage device on which embodiments of the present disclosure may be used.

Referring now to FIG. 9, a simplified block diagram of a storage system 900 in accordance with an embodiment of the present disclosure is shown. Storage system 900 may be any storage system, such as is in one embodiment a hard disc drive including by way of example rotatable discs; write heads; and associated controllers such as are known in the art; or in another embodiment a solid state drive including non-volatile memory and associated controllers such as are known in the art; or any other storage system for persistent storage of information. System 900 may include, by way of example, a controller 902 coupleable via a bus 904 or the like to a host system 950, where the host system 950 may provide power over the bus 904 or through a separate power bus (not shown), and a storage component 906 (such as rotatable platters or nonvolatile memory). A power on reset circuit such as circuit 500 may be provided either as a stand-alone device between the host 950 and storage device 900, or as a part of the storage device 900, such as on an integrated circuit, ASIC, or the like.

It should be understood that the power on reset circuit embodiments described herein may be used for determination of a stable power situation between a power device and an integrated circuit, and that such power devices and integrated circuits may vary without departing from the scope of the disclosure.

In accordance with various embodiments, the methods described herein may be implemented as one or more software programs running on one or more microprocessors or controllers, such as the microprocessor/controller included in data storage device 900. Dedicated hardware implementations including, but not limited to, application specific integrated circuits, programmable logic arrays and other hardware devices can likewise be constructed to implement the methods described herein, or to incorporate the circuitry described herein.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A power on reset circuit, comprising:
   a pullup device comprising a voltage divider with a first end coupleable to a supply voltage, a second end, and a pair of elements, a first of the pair of elements coupled between the first end and a node between the pair of elements, and a second of the pair of elements coupled between the node and the second end;
   a switch drain to source coupled between the second end and a reference voltage;
   a first decoupling capacitor coupled between the second end and the reference voltage; and
   a second decoupling capacitor coupled between the node and the reference voltage, the second decoupling capacitor decoupling low frequency noise.

2. The power on reset circuit of claim 1, wherein the first decoupling capacitor has a capacitance of about 100 picoFarads (pF).

3. The power on reset circuit of claim 1, wherein the second decoupling capacitor has a capacitance of about 1000 pF.

4. The power on reset circuit of claim 1, wherein the pullup device is a resistive voltage divider.

5. The power on reset circuit of claim 4, wherein the first of the pair of elements has a resistance of about 100 Ohms ($\Omega$).

6. The power on reset circuit of claim 4, wherein the second of the pair of elements has a resistance of about 900$\Omega$.

7. The power on reset circuit of claim 1, wherein the first decoupling capacitor decouples high frequency noise.

8. The power on reset circuit of claim 1, wherein the pullup device is configured to supply approximately 90% of the supply voltage to the node.

9. A method of electrostatic discharge protection for an integrated circuit, comprising:
   charging a node of a voltage divider coupled between a supply voltage and a power on reset trace to a predetermined percentage of the supply voltage;
   decoupling high frequency noise with a first decoupling capacitor between the power on reset trace and a reference voltage; and
   decoupling low frequency noise with a second decoupling capacitor between the node and the reference voltage, the decoupling low frequency noise being performed using a capacitance of about 1000 picoFarads (pF).

10. The method of claim 9, wherein decoupling high frequency noise is performed using a capacitance of about 100 pF.

11. The method of claim 9, wherein charging a node of the voltage divider comprises charging through a first resistor.

12. The method of claim 11, wherein charging the node comprises charging through a resistance of about 100 Ohms ($\Omega$).

13. The method of claim 12, further comprising charging the power on reset trace through a resistance of about 900$\Omega$.

14. The method of claim 9, wherein charging a node of a voltage divider comprises charging to approximately 90% of the supply voltage.

15. A data storage device, comprising:
   a controller coupleable to an external host;
   a storage component coupled to the controller; and
   a power on reset circuit coupled to the controller to allow operation of the data storage device upon receipt of stable power, the power on reset circuit comprising:
      a pullup device comprising a voltage divider with a first end coupleable to a supply voltage, a second end, and a pair of elements, a first of the pair of elements coupled between the first end and a node between the pair of elements, and a second of the pair of elements coupled between the node and the second end;
      a switch drain to source coupled between the second end and a reference voltage;
      a first decoupling capacitor coupled between the second end and the reference voltage; and
      a second decoupling capacitor coupled between the node and the reference voltage, the second decoupling capacitor decoupling low frequency noise.

16. The data storage device of claim 15, wherein the storage component is an array of non-volatile memory.

17. The data storage device of claim 15, wherein the storage component is a plurality of magnetic disc storage devices.

18. The data storage device of claim 15, wherein the pullup device is a resistive voltage divider.

19. The data storage device of claim 15, wherein the pullup device is configured to supply approximately 90% of the supply voltage to the node.

* * * * *